United States Patent
Sakai et al.

(10) Patent No.: US 6,303,944 B1
(45) Date of Patent: *Oct. 16, 2001

(54) METHOD OF MANUFACTURING A SEMICONDUCTOR DEVICE HAVING A MONITOR PATTERN, AND A SEMICONDUCTOR DEVICE MANUFACTURED THEREBY

(75) Inventors: Yuichi Sakai, Toiyo; Hiroyuki Chibahara, Tokyo; Masanobu Iwasaki, Tokyo; Kakutaro Suda, Tokyo, all of (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/122,765

(22) Filed: Jul. 27, 1998

(30) Foreign Application Priority Data

Feb. 3, 1998 (JP) .................................................. 10-022189

(51) Int. Cl.$^7$ ................................................. H01L 23/58
(52) U.S. Cl. ............................................................... 257/48
(58) Field of Search .................... 438/11, 14, 17, 438/18, 633, 691; 257/48

(56) References Cited

U.S. PATENT DOCUMENTS

| 5,234,868 | | 8/1993 | Cote . | |
| 5,289,422 | * | 2/1994 | Mametani | 257/296 |
| 5,552,996 | * | 9/1996 | Hoffman et al. | 438/692 |
| 5,639,697 | * | 6/1997 | Weling et al. | 438/633 |
| 5,703,381 | * | 12/1997 | Iwasa et al. | 257/48 |

FOREIGN PATENT DOCUMENTS

| 59-136934 | 8/1984 | (JP) . |
| 09-139369 | 5/1997 | (JP) . |

* cited by examiner

Primary Examiner—Sara Crane
Assistant Examiner—Thien F. Tran
(74) Attorney, Agent, or Firm—McDermott, Will & Emery (57) ABSTRACT

The semiconductor device includes a semiconductor wafer which is partitioned into chip regions by scribe line area. A device pattern is formed in the device forming region included in the chip region. A monitor pattern is formed from the same material as that of the device patterns in the chip region simultaneously with the device pattern. An interlayer insulating film is formed in the chip region so as to cover the device pattern and the monitor pattern. The monitor pattern is used to measure the thickness of the interlayer insulating film.

5 Claims, 8 Drawing Sheets

PRIOR ART

PRIOR ART

METHOD OF MANUFACTURING A SEMICONDUCTOR DEVICE HAVING A MONITOR PATTERN, AND A SEMICONDUCTOR DEVICE MANUFACTURED THEREBY

BACKGROUND OF THE INVENTION

1. Field of the Invention

The present invention relates to a semiconductor device and a manufacturing method thereof, in which a monitor pattern is provided for accurate measurement of the thickness of an interlayer insulating film.

2. Background Art

In recent years, silicon integrated circuit devices have been miniaturized in a vertical direction less than in a horizontal direction. For this reason, recent semiconductor devices have become more three-dimensional, and an absolute step becomes larger in the scale of a chip or wafer.

With a view to miniaturizing semiconductor memory while ensuring an increase in the capacitance of a capacitor, memory cells become more three-dimensional, and a large step arises between the memory cells and peripheral circuits. In an integrated logic circuit, wiring patterns are multilayered in order to improve the performance and speed of the logic circuit. As a result, a step is formed between an area where wiring patterns are densely formed and an area where wiring patterns are sparsely formed. Such a step poses a serious problem in transferring a pattern on a substrate.

With regard to the pattern transfer technique, an increase in resolving power imposes a problem of a shallow depth of focus. The depth of focus becomes significantly small as a result of an increase in the aperture of a lens or of a reduction in the wavelength of light. Such a reduction in the depth of focus presents a problem in miniaturizing a semiconductor device as the device becomes more three-dimensional. If an attempt is made to miniaturize the semiconductor device to a much greater extent, a polarization technique for smoothing the absolute step must be adopted into the pattern transfer process in order to enable a pattern to be transferred at a small depth of focus.

Conventionally-employed techniques for smoothing an inter-layer insulation film, such as SOG or BPSG reflow techniques, are for local smoothing, e.g., an area of micrometers. For this reason, it is impossible to smooth the absolute steps in the scale of a chip or wafer using these techniques. For the time being, it is only possible to use a chemical mechanical polishing method.

To respond to such a demand, a chemical mechanical polishing method (hereinafter often referred to as a CMP or a CMP method) such as that shown in FIG. 7 has already been proposed [see Japanese Patent Publication (Tokyo Koho) No. 5-30052 or Japanese Patent Application Laid-open (Kokai) No. 7-285050].

Figure 7:
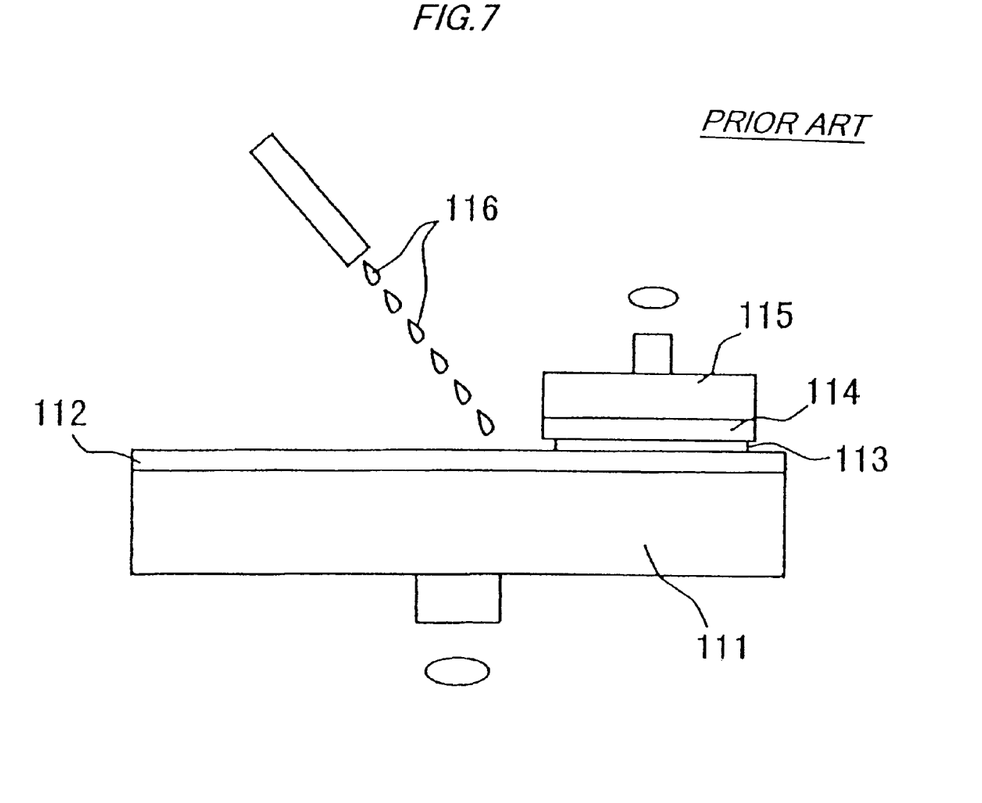
FIG. 7 is an illustration for explaining a chemical mechanical polishing method.

In FIG. 7, reference numeral 111 designates a rotary table (or platen); 112 designates an abrasive cloth; 113 designates a semiconductor wafer having an insulating film formed thereon; 114 designates packing material; 115 designates an abrasive head; and 116 designates an abrasive agent. The abrasive cloth 112 is attached to the rotary table 111 with an adhesive, and the rotary table 111 rotates around a spindle. The packing material 114 is fixed on the abrasive head 115 with an adhesive. The semiconductor wafer 113 having an insulating film is attached to the packing material 114 with the surface of the insulating film facing down by means of vacuum chucking or surface tension of water.

An actual abrasive method will be described by reference to FIG. 7. In FIG. 7, the rotary table 111 is rotated around the spindle, and the abrasive head 115 is also rotated around another spindle. While the abrasive agent 116 is applied to the surface of the abrasive cloth 112 at a given flow rate, the abrasive head 115 is pressed against the abrasive cloth 112 at a given pressure, whereby the surface of the insulating film of the semiconductor wafer 113 is abraded.

FIGS. 8A to 8F are illustrations for explaining an example of an actual abrasive process which uses such a CMP method. In FIGS. 8A to 8F, reference numeral 21 designates a silicon substrate; 22 designates an oxide film; 23 designates a first diffused layer; 24 designates a nitride film; 25 designates a silicon electrode; 26 designates a second diffused layer; 27 designates an insulating film provided below a wiring pattern (hereinafter simply referred to as an insulating film); 28 designates a first metal wiring layer; 29 designates an interlayer insulating film; and 30 designates a second metal wiring layer.

Figure 8A:
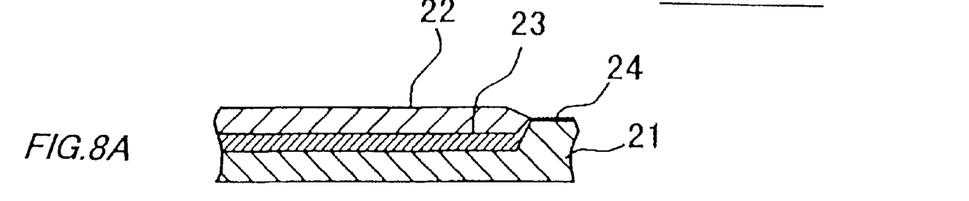
FIGS. 8A to 8F are illustrations for explaining an example of an actual abrasive process which uses such a CMP method.
Figure 8B:
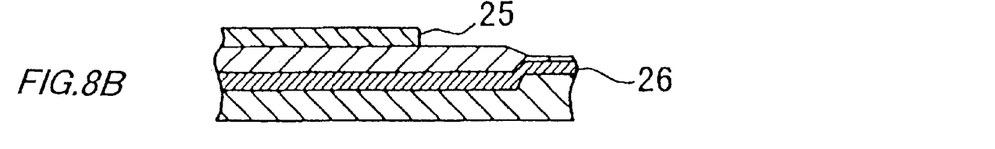
Figure 8C:
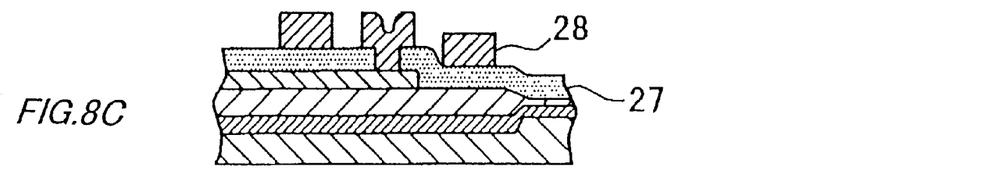
Figure 8D:
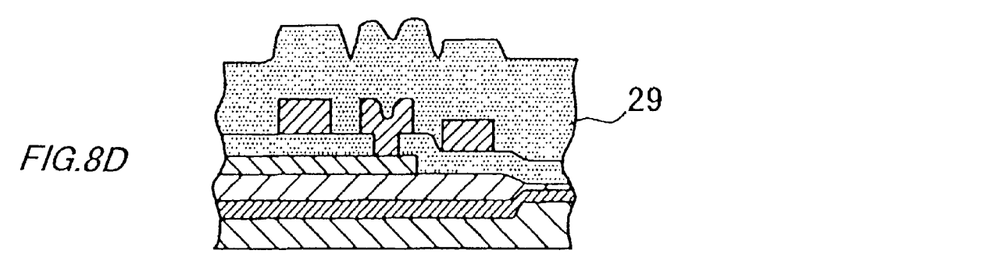
Figure 8E:
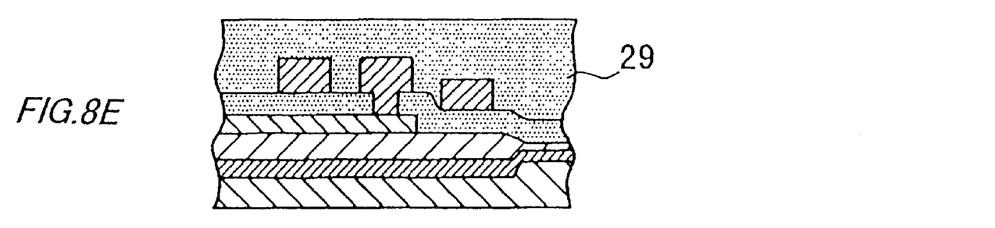
Figure 8F:
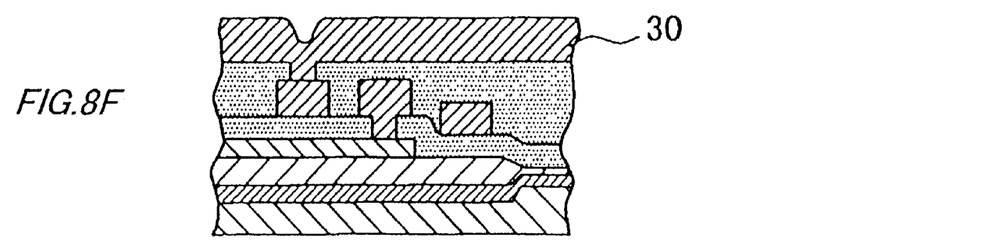

The nitride film mask 24 is formed on the silicon substrate 21, and the oxide film 22 and the first diffused layer 23 are formed on the nitride film mask (FIG. 8A). The silicon electrode 25 and the second diffused layer 26 are formed on the oxide film 22 (FIG. 8B). After formation of the insulating film 27, a contact hole is formed in the insulating film, and the first metal wiring layer 28 is formed on the insulating film 27 (FIG. 8C). The interlayer insulating film 29 is formed on the first metal wiring layer 28 and the insulating film 27 (FIG. 8D). Subsequently, the interlayer insulating film 29 is smoothed through use of the foregoing chemical mechanical polishing method (FIG. 8E). After a through hole has been formed in the interlayer insulating film, the second metal wiring layer 30 is formed on the interlayer insulating film (FIG. 8F).

At this time, in terms of product control, the thickness of a film, the amount of abrasion, and the thickness of a film after abrasion must be controlled by measuring the thickness of the interlayer insulating film 29 from above an aluminum wiring pattern.

To this end, a pattern for the purpose of measuring film thickness is formed in a scribe line, and the thickness of a film before and after abrasion is usually controlled through use of the thus-formed pattern.

Figure 9:
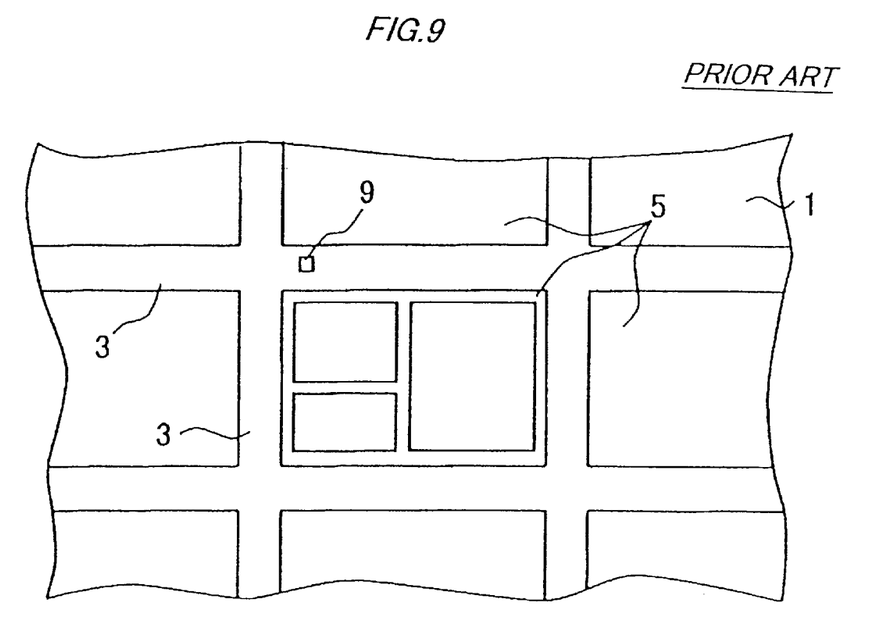
FIG. 9 is a schematic representation showing an example of layout of a monitor pattern for the purpose of measuring film thickness conventionally formed in a semiconductor wafer.

FIG. 9 is a schematic representation showing an example of layout of a monitor pattern for the purpose of measuring film thickness conventionally formed in a semiconductor wafer. In the drawing, reference numeral 1 designates a semiconductor wafer; 3 designates a scribe line area (hereinafter also referred to as a scribe line, as required); 5 designates a chip formed on the semiconductor wafer 1; and 9 designates a monitor pattern for the purpose of measuring film thickness formed in the scribe line 3.

Under the foregoing chemical mechanical abrasive method, the flatness of a film is dependent on a pattern formed thereon. In short, it takes a longer time to smooth steps as the pattern becomes broader and denser. In the case of a semiconductor device—in which patterns are densely formed over a broad area within a chip—such as DRAM or a DRAM-mixed logic IC, a result which is obtained by measurement of thickness of the film using the film-thickness monitor pattern 9 of the scribe line does not necessarily match the thickness of a circuit portion of the film actually measured. Such a discrepancy in thickness poses a problem of deterioration of reliability of CMP process control.

SUMMARY OF THE INVENTION

The present invention has been contrived to solve the foregoing problem in the background art, and the object of the present invention is to provide a structure and a manufacturing method of a semiconductor device which enables accurate measurement of thickness of a polished and smoothed insulating film.

According to one aspect of the present invention, a semiconductor device comprises a semiconductor wafer partitioned into a plurality of chip regions by a scribe line area. At least one device formation region is provided in the chip region. A device pattern is provided in the device formation region. A monitor pattern is provided in the chip region. An interlayer insulating film is provided on the semiconductor wafer so as to cover the device pattern and the monitor pattern. Thus, the thickness of the interlayer insulating film may be measured on the monitor pattern.

In the semiconductor device, the monitor pattern is provided preferably in the device formation region or adjoining the device forming region.

In another aspect, in the semiconductor device, a memory cell pattern is provided in the device forming area.

In another aspect, in the semiconductor device, device patterns are provided with a device pattern density of 50% or less and more than 50%, and each monitor pattern is formed in the device forming areas.

In the semiconductor device, the monitor pattern has preferably a shorter side of 5 $\mu$m or more and a longer side of 150 $\mu$m or less.

According to another aspect of the present invention, in a method of manufacturing a semiconductor device, a semiconductor wafer is partitioned into a plurality of chip regions by a scribe line area. At least one device formation region is defined in the chip region, A device pattern is formed in the device formation region. A monitor pattern is formed simultaneously with the device pattern in the chip region. An interlayer insulating film is formed on the semiconductor wafer so as to cover the device pattern and the monitor pattern. Thus, the monitor pattern may be used to measure the thickness of the interlayer insulating film.

Other and further objects, features and advantages of the invention will appear more fully from the following description.

BRIEF DESCRIPTION OF THE DRAWINGS

FIGS. 1 through 3 show a method of manufacturing a semiconductor device and a semiconductor device manufactured by the method according to a first embodiment of the present invention;

BEST MODE FOR CARRYING OUT THE INVENTION

Some embodiments of the present invention will be described hereinbelow by reference to the accompanying drawings. In the drawings, like reference numerals designate like or corresponding parts.

First Embodiment

Figure 1A:
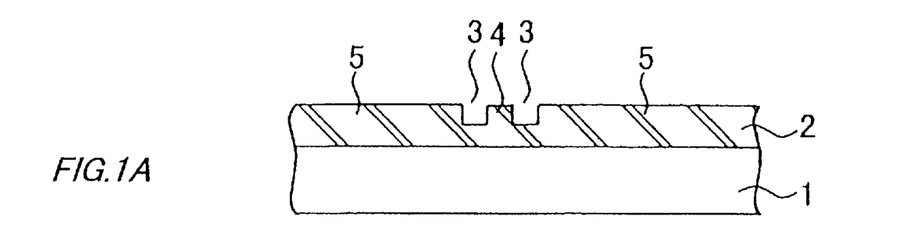
FIGS. 1A to 1E are cross-sectional views showing a process of manufacturing a semiconductor device.
Figure 1B:
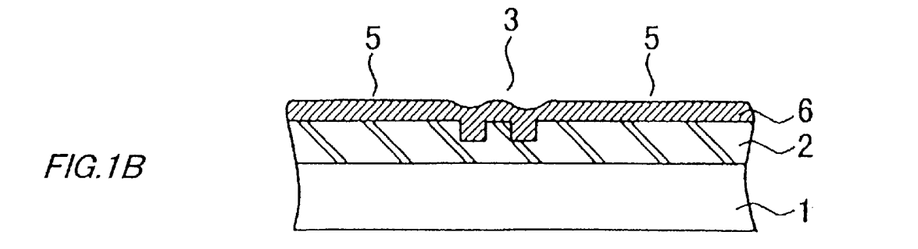
Figure 1C:
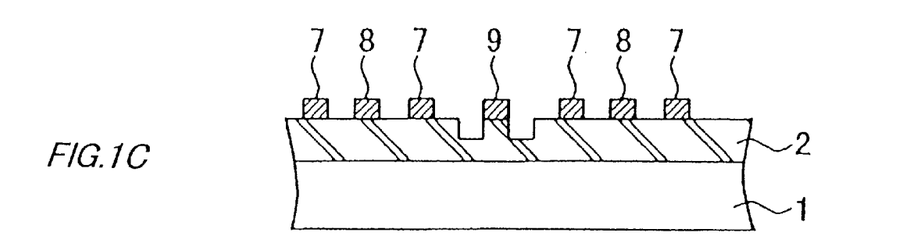
Figure 1D:
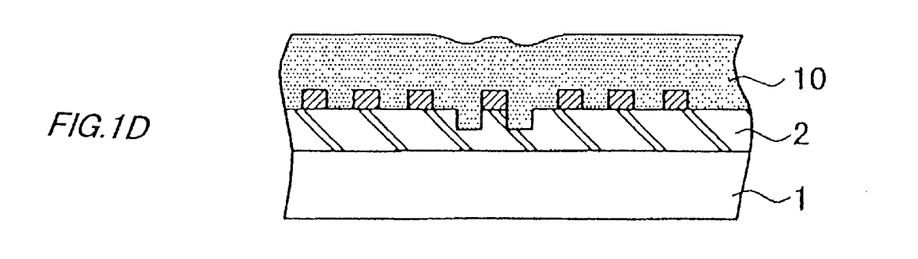
Figure 1E:
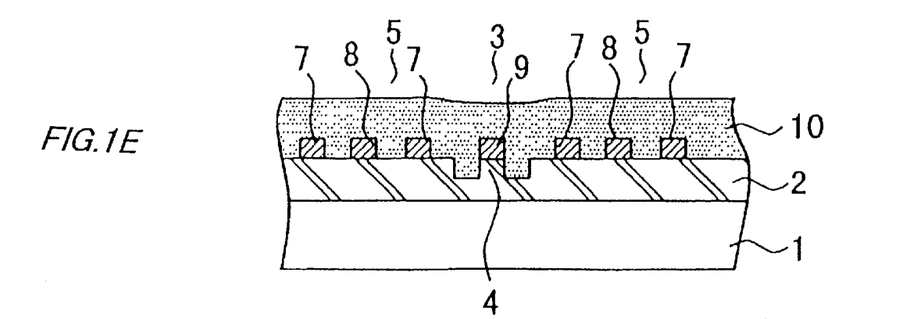
Figure 2:
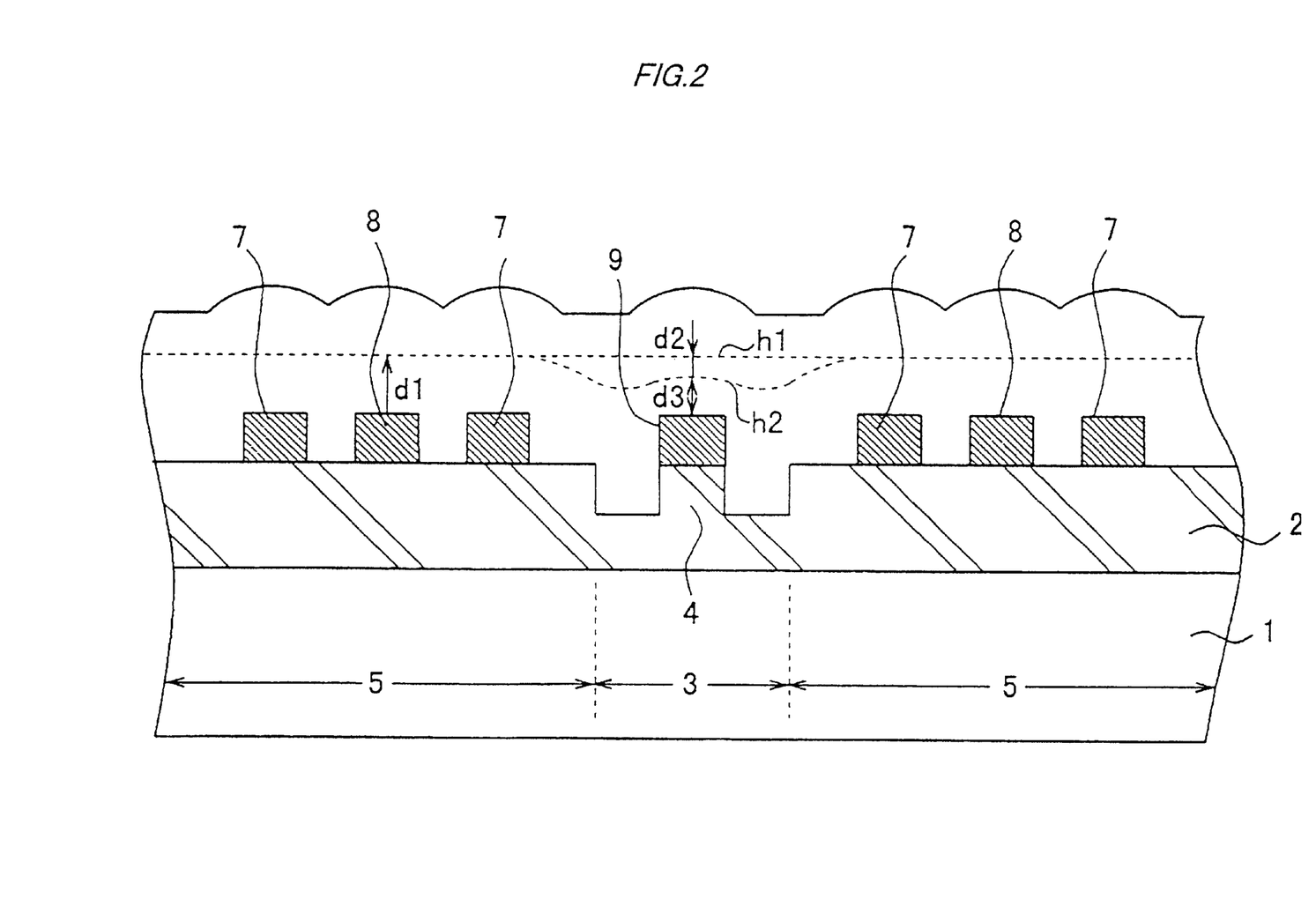
FIG. 2 is a cross-sectional view for explaining the structure of the semiconductor device.
Figure 3:
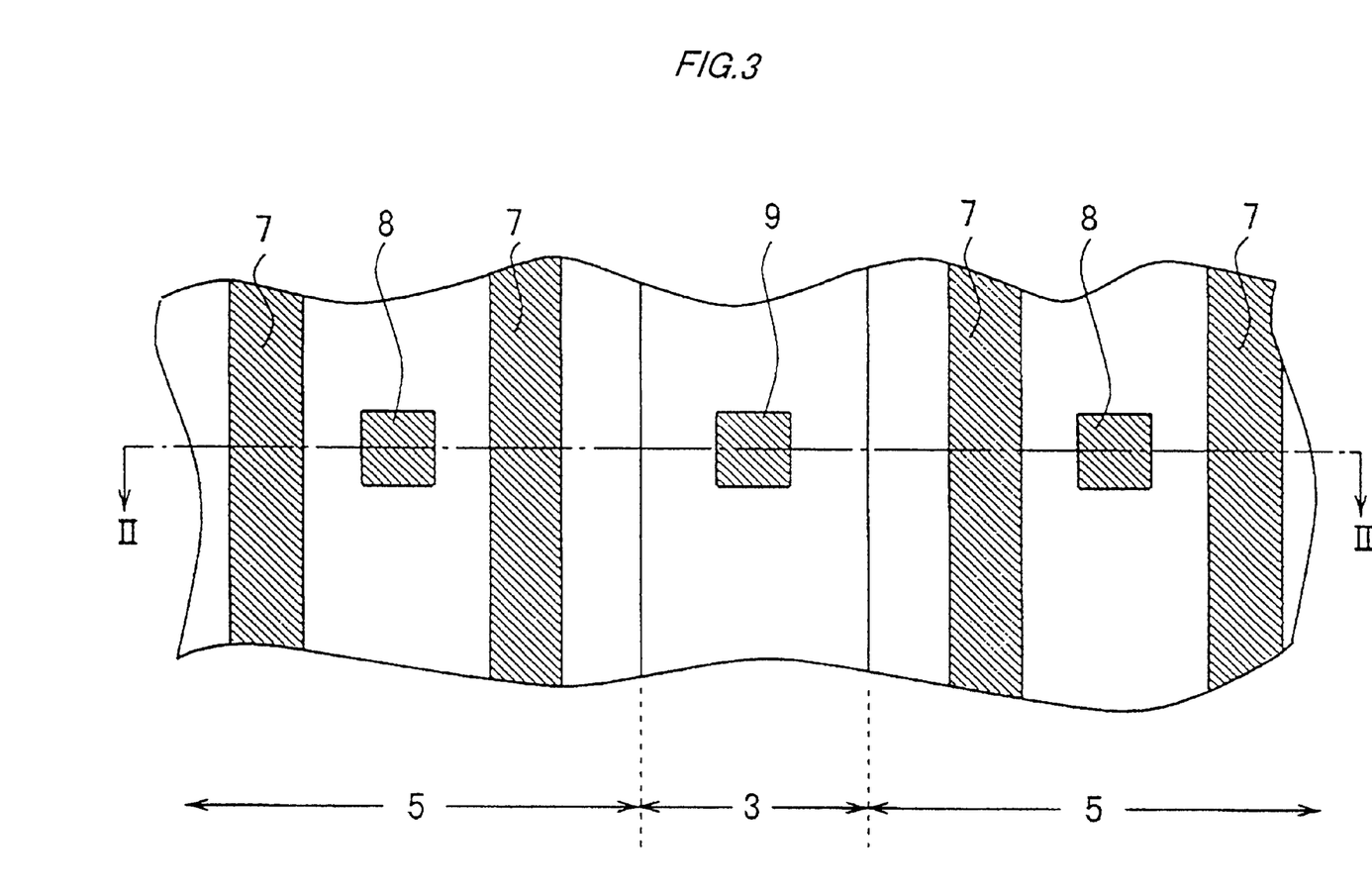
FIG. 3 is a plan view showing the structure of the semiconductor device.

FIGS. 1 through 3 show a method of manufacturing a semiconductor device and a semiconductor device manufactured by the method according to a first embodiment of the present invention. FIGS. 1A to 1E are cross-sectional views showing a process of manufacturing a semiconductor device; FIG. 2 is a cross-sectional view for explaining the structure of the semiconductor device; and FIG. 3 is a plan view showing the semiconductor device.

The method of manufacturing a semiconductor device according to the first embodiment will be described by reference to FIG. 1. First, as shown in FIG. 1A, a silicon oxide film is formed as a substrate insulating film 2 on a silicon semiconductor wafer 1, and scribe line areas 3, which will be used later when the semiconductor wafer 1 is scribed, are linearly formed in the substrate insulating film 2 by etching. (An island 4 is shown for comparison purposes, the island being conventionally formed in the scribe line areas 3). As a result of presence of the scribe line areas 3, the semiconductor wafer 1 is divided into chip regions 5. The plurality of scribe line areas 3 are formed over the semiconductor wafer 1 in longitudinal and lateral directions, so that the plurality of chip regions 5 are formed. However, FIG. 1 merely shows a typical portion of the structure, and the other areas or regions are omitted from the drawings.

Next, as shown in FIG. 1B, a device pattern for the purpose of forming a device is formed on the substrate insulating film 2. More specifically, in this example, a wiring layer 6 is first formed.

As shown in FIG. 1C, the wiring layer 6 is selectively etched away, thereby forming a plurality of wiring patterns 7. Simultaneously, a monitor pattern 8, which will be used for measuring a thickness of an interlayer insulating film later, is formed in each of the chip regions 5. (A monitor pattern 9 is illustrated for comparison purposes, and the monitor pattern 9 is conventionally formed on the island 4 provided in the scribe line areas 3).

For example, an aluminum layer or a polysilicon layer is formed as the wiring layer 6. The wiring pattern 7 is usually linearly formed, and the monitor pattern 8 is usually formed into a quadrilateral shape.

The monitor pattern 8 is formed in a device formation area of the chip region 5 where a predetermined device is to be formed, as required.

As shown in FIG. 1D, a silicon oxide film is formed as an interlayer insulating film 10 over the entire semiconductor wafer 1 so as to cover the device and monitor patterns. As shown in the drawing, the interlayer insulating film 10 is irregularly formed corresponding to the density of patterns.

Then, as shown in FIG. 1E, the interlayer insulating film 10 is smoothed. This smoothing operation is a process necessary to form a layer used for forming a device further on the interlayer insulating film 10. The film is usually smoothed by the chemical mechanical polishing method (CMP method) as previously mentioned in the description of the background art. Although irregularities of the surface of the interlayer insulating film 10 are made flat as a result of the smoothing treatment, the surface does not become perfectly flat.

In a specific example of a device pattern of a semiconductor device, the wiring pattern 7 is formed to, e.g., several micrometers in width and about 0.5 to 1 μm in thickness. Further, the interlayer insulating film 10 is formed to, e.g., about 2 μm in thickness, and thereafter the interlayer insulating film 10 is abraded by 0.5 to 1 μm in thickness.

With a view to adjusting the thickness of the interlayer insulating film 10 to a desired thickness by controlling a process relating to the chemical mechanical polishing method (CMP method) so as to ensure a desired amount of abrasion of the interlayer insulating film 10 during the foregoing process of manufacturing a semiconductor device, the thickness of the interlayer insulating film 10 must be accurately measured in the device formation area, or an area where the patterns for the purpose of forming a device are formed.

For this reason, in the first embodiment, the monitor pattern 8 is formed in each chip region 5.

It is desirable to form the monitor pattern 8 so as to have a shorter side of 5 μm or more and a longer side of 150 μm or less. Since a light beam for measuring purposes has a diameter of about 4 to 5 μm, the monitor pattern can be measured, so long as the length of one side, or the diameter, of the pattern is substantially the same as the diameter of the light beam. If the monitor pattern is too large, the pattern will hinder formation of the device pattern. In view of making it easy to automatically measure the monitor pattern during the manufacturing process in the factory, a convenient length of one side, or a convenient diameter, of the monitor pattern ranges from 100 to 150 μm or thereabouts.

FIG. 2 is an enlarged cross-sectional view showing the semiconductor wafer 1 provided in FIG. 1E, and FIG. 3 is a plan view showing the plane surface of the semiconductor wafer 1 and the layout of the monitor patterns 8 on the wafer. FIG. 2 is taken across line II—II shown in FIG. 3.

Provided that a perfect plane surface is formed through chemical mechanical polishing, the surface is represented by broken line ha shown in FIG. 2. In practice, a perfect plane surface is not formed but is a slightly irregular surface such as that represented by broken line h2 is formed. In the chip region 5 having a high density of a pattern, the amount of abrasion of the interlayer insulating film is small. In contrast, in the scribe line area 3 having a low density of a pattern, the amount of abrasion of the interlayer insulating film becomes large, thereby forming a deep indentation. The difference in thickness between the chip region 5 and the scribe line area 3 is indicated by d2 in the drawing.

In other words, as indicated by d1 in the drawing, the interlayer insulating film 10 is thick in the chip region 5. In contrast, as indicated by d3 in the drawing, the interlayer insulating film 10 is thin in the scribe line area 3.

Accordingly, if the thickness of the interlayer insulating film 10 is measured through use of the monitor pattern 9 formed on the island 4 in the scribe line area 3 as in the case of the conventional method, the thickness of the interlayer insulating film 10 in the chip region 5 cannot be accurately measured.

In contrast, according to the first embodiment, since the monitor pattern 8 is formed in each chip region 5, the thickness of the interlayer insulating film 10 in the chip region 5 can be accurately measured. As a result, the polarity of the interlayer insulating film on the semiconductor wafer can be comprehensively evaluated. Accordingly, a transfer margin of a mask pattern may be ensured and the efficiency of product control may be improved. So long as the result of such evaluation is fed back to conditions for polishing, a reduction in variations in products and an improvement in manufacturing yields can be expected.

Second Embodiment

Figure 4:
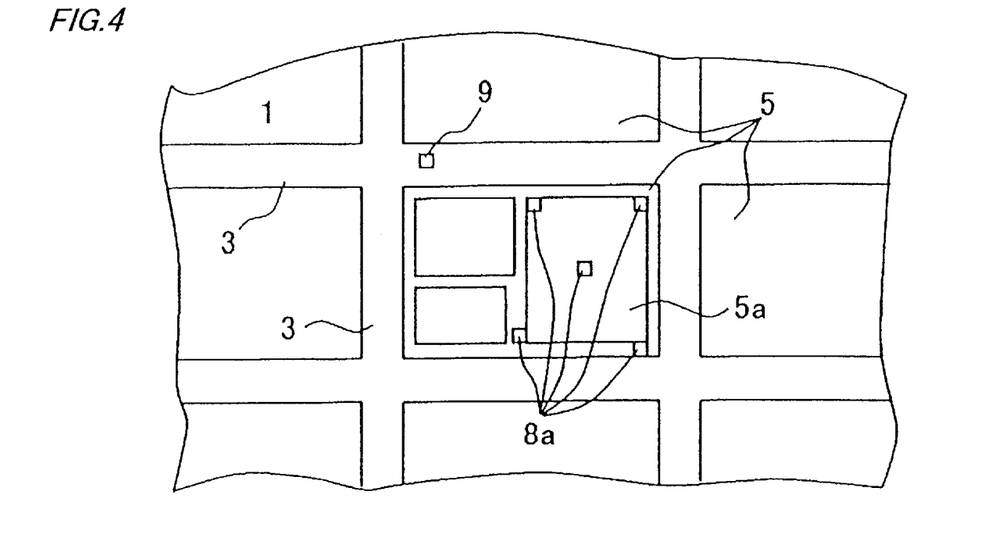
FIG. 4 is a plan view showing a semiconductor device according to a second embodiment of the present invention.

FIG. 4 is a plan view showing a semiconductor device according to a second embodiment of the present invention.

In FIG. 4, reference numeral 1 designates a semiconductor wafer; 3 designates a scribe line area; 5 designates a chip region; 5a designates a memory cell in the chip region 5; 8a designates a monitor pattern for the purpose of measuring film thickness; and 9 designates a conventional monitor pattern illustrated for comparison purposes.

As shown in FIG. 4, according to the second embodiment, the plurality of chip regions 5 are formed on the semiconductor wafer 1 and are partitioned by the scribe line areas 3. For example, the memory cell 5a is formed as a device formation area in the chip region 5. A predetermined device pattern is formed on the surface of the chip region 5 in given processes. More specifically, wiring patterns are formed.

Simultaneously, the monitor patterns 8a for the purpose of measuring film thickness are formed at the center of and along the edges of the memory cell 5a or adjoining to the edges. An interlayer insulating film is formed on the memory cell, and the thus-formed interlayer insulating film is smoothed and abraded by a chemical mechanical polishing method. A specific polishing method which employs the chemical mechanical polishing method may be a conventional one. After abrasion of the interlayer insulating film, the thickness of the interlayer film formed on the monitor patterns 8a is measured through use of, e.g., an optical film thickness measuring instrument model UV-1050 manufactured by Tencole Co., Ltd.

Depending on the pattern, there was a discrepancy in the film thickness ranging from 1000 Å to 5000 Å between the measurement result obtained through use of the monitor patterns 8 and the measurement result obtained through use of the conventional monitor pattern 9 formed in the scribe line area 3.

A conceivable reason for this is that where a chip having a pattern, the pattern including a memory cell for example, is abraded, the actual thickness of the film can be more accurately measured through use of the monitor patterns 8a provided inside or in the vicinity of the memory cell 5a than use of the monitor pattern 9 formed in the scribe line area 3.

As has been described previously, according to the second embodiment, the monitor pattern for the purpose of measuring film thickness is formed in the device formation area of the semiconductor chip. Accordingly, in the case of a chip which has great dependence on a pattern because of the presence of memory cells included therein, the thickness of the film in the vicinity of the memory cell can be directly measured after the film has been subjected to CMP treatment. As a result, the polarity of the interlayer insulating film on the semiconductor wafer can be comprehensively evaluated, resulting in an improvement in ensuring a transfer margin of a mask pattern and in improvement of efficiency of product control. So long as the result of such evaluation is fed back to conditions for polishing, a reduction in variations in products and an improvement in manufacturing yields can be expected.

Third Embodiment

Figure 5:
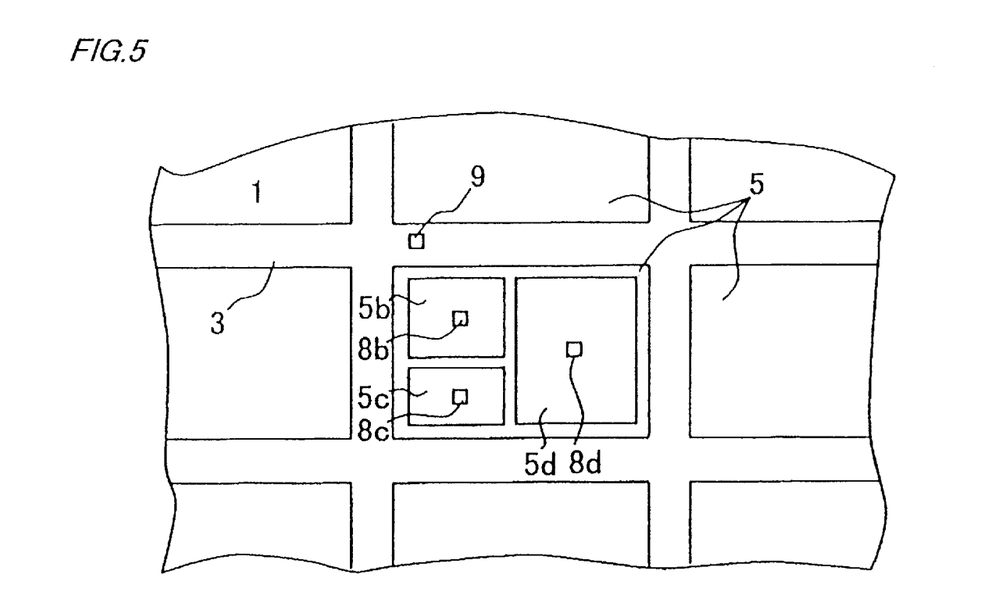
FIG. 5 is a plan view showing a structure of a semiconductor device according to a third embodiment of the present invention.

FIG. 5 is a plan view showing a semiconductor device according to a third embodiment of the present invention.

In FIG. 5, reference numeral 1 designates a semiconductor wafer; 3 designates a scribe line area; 5 designates a chip area; and 5b, 5c, and 5d designate device formation areas which are formed in the chip region 5 and respectively have a pattern density of 30%, 40%, and 70%. Further, reference numerals 8b, 8c, and 8d designate monitor patterns for the purpose of measuring film thickness formed respectively in the device formation areas 5b, 5c, and 5d.

In the third embodiment, wiring patterns are formed in the device formation areas 5b, 5c, and 5d such as those shown in FIG. 5, and an interlayer insulating film is formed over the memory cell. The thus-formed interlayer insulating film is smoothed and abraded by the chemical mechanical polishing method. A specific polishing method which employs the chemical mechanical polishing method may be a conventional one. After abrasion of the interlayer insulating film, the thickness of the films formed on the monitor patterns 8a, 8b, and 8c is measured through use of, e.g., optical film thickness measuring instrument model UV-1050 manufactured by Tencole Co., Ltd.

Depending on the patterns formed in the device formation areas 5b, 5c, and 5d, there were discrepancies in film thickness ranging from 1000 Å to 5000 Å between the measurement results obtained through use of the monitor patterns 8 and the measurement result obtained through use of the conventional monitor pattern 9 formed in the scribe line area 3. Even among the measurement results obtained at the monitor patterns 8b, 8c, and 8c, there were discrepancies in film thickness ranging from 1000 to 3000 Å. A conceivable reason for this is that where a chip having different densities of wiring patterns is abraded on each device formation region or each block, the actual thickness of the film can be more accurately measured through use of the monitor patterns 8b, 8c, and 8d provided in the respective blocks than use of the monitor pattern 9 formed in the scribe line area 3. It is also obvious that discrepancies in film thickness among positions within one chip can be clearly measured.

It is generally known that with regard to the amount of abrasion there is a great difference between a chip having a device pattern density of 50% or less and a chip having a device pattern density of more than 50%. It is also said that the amount of abrasion corresponds to the inverse of a pattern density. Consequently, even in the process of manufacturing a semiconductor device, it is important to accurately ascertain the thickness of the insulating film after abrasion with regard to the area having a device pattern density of 50% or less and to the area having a device pattern density more than 50%.

For this reason, according to the third embodiment, the monitor patterns for the purpose of measuring the thickness of the insulating film are formed respectively in the area having a device pattern density of 50% or less and the area having a device pattern density of more than 50%.

As described above, according to the third embodiment, in a case where one chip includes blocks or device formation regions having different pattern densities, e.g., a chip which has great dependence on a pattern because of the presence of memory cells included therein, the thickness of the insulating film after the film has been subjected to the CMP operation can be directly measured with regard to the blocks having different pattern densities. As a result, the polarity of the interlayer insulating film on the semiconductor wafer can be comprehensively evaluated, resulting in an improvement in ensuring a transfer margin and in efficiency of product control. So long as the result of such evaluation is fed back to conditions for polishing, a reduction in variations in products and an improvement in manufacturing yields can be expected.

Fourth Embodiment

Figure 6A:
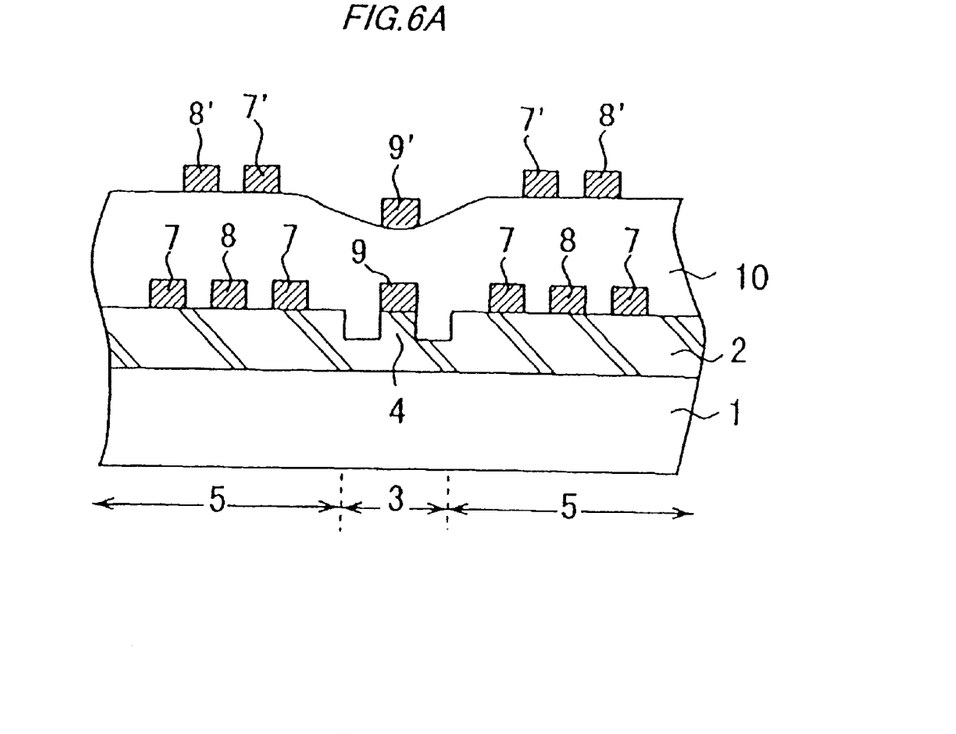
FIGS. 6A and 6B are cross-sectional views showing a structure of a semiconductor device according to a fourth embodiment of the present invention.
Figure 6B:
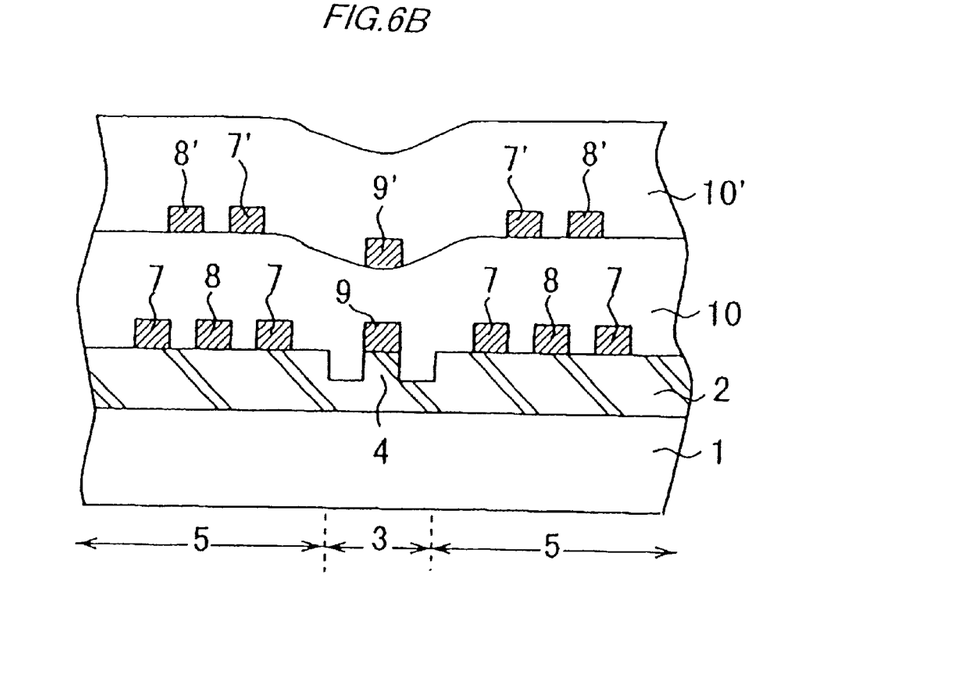

FIGS. 6A and 6B are cross-sectional views showing a semiconductor device according to a fourth embodiment of the present invention.

More specifically, the present embodiment is directed to a device comprising wiring patterns further formed on an interlayer insulating film as shown in FIG. 1E in the first embodiment. As shown in FIG. 6A, upper wiring patterns 7 are formed on the smoothed interlayer insulating film. Simultaneously, monitor patterns 8 are formed on the interlayer insulating film. (A monitor pattern 9 is illustrated for comparison purposes, and is conventionally formed in the scribe line areas 3.)

Next, as shown in FIG. 6B, after an interlayer insulating film 10 has been formed on the entire semiconductor wafer 1 so as to cover the device and monitor patterns, the insulating film 10 is smoothed. The insulating film is usually smoothed by chemical mechanical polishing. Although the irregularities of the surface of the interlayer insulating film 10 are smoothed as a result of the smoothing operation, gentle steps still remain on the surface of the insulating film.

According to the fourth embodiment, the thickness of the interlayer insulating film 10 is measured through use of the monitor patterns 8 formed in the chip regions 5.

Although the foregoing description has explained the measurement of thickness of the second interlayer insulating film 10, the same applies to interlayer insulating films at all levels in a stacked structure of the device. In the manufacture of a semiconductor device, a plurality of device patterns and interlayer insulating films are formed in a stacked manner. The present invention enables measurement of thickness of the insulating film formed on the device pattern irrespective of an underlying layer, and allows feeding back of the result of such measurement to process control.

Although the monitor patterns are formed in the chip region other than in the scribe line area in the foregoing embodiments, a plurality of monitor patterns maybe formed not only in the chip region but also in the scribe line area, as required.

The effects and advantages of the present invention may be summarized as follows.

As has been described above, according to the present invention, monitor patterns for the purpose of measuring the thickness of an insulating film are formed in the chip region of the semiconductor wafer, or more specifically in specific device formation regions in the chip region, and the thickness of the insulating film in the chip region or in the specific device formation areas within the chip region can be more accurately measured.

Further, the thickness of the insulating film in several device formation regions in one chip can also be more accurately measured.

As a result, the polarity of the interlayer insulating film on the semiconductor wafer can be comprehensively evaluated. As a result, a transfer margin of a mask pattern may be ensured and the efficiency of product control is improved. So long as the result of such evaluation is fed back to conditions for polishing, a reduction in variations in products and an improvement in manufacturing yields can be expected.

Obviously many modifications and variations of the present invention are possible in the light of the above teachings. It is therefore to be understood that within the scope of the appended claims the invention may by practiced otherwise than as specifically described.

What is claimed is:

1. A semiconductor device comprising:

a semiconductor wafer partitioned into a plurality of chip regions by a scribe line area;

at least one device formation region formed in said plurality of chip regions;

a device pattern formed in said at least one device formation region;

a monitor pattern having planar dimensions of at least 5 μm on a shorter side and 150 μm or less on a longer side, said monitor pattern being formed simultaneously with said device pattern in said plurality of chip regions; and an interlayer insulating film formed on said semiconductor wafer so as to cover said device pattern and said monitor pattern;

wherein the thickness of said interlayer insulating film is measurable using said monitor pattern, and wherein the measured thickness of said interlayer insulating film is used for controlling a chemical mechanical polishing process to reduce over polishing and under polishing.

2. The semiconductor device as defined in claim 1, wherein said monitor pattern is formed in said device formation region or adjoining said device formation region.

3. The semiconductor device as defined in claim 1, wherein a plurality of memory cell patterns are formed in said at least one device formation region.

4. The semiconductor device as defined in claim 1, wherein:

one device pattern having a device pattern density of 50% or less is formed in a first device formation region and another device pattern having a device pattern density more than 50% is formed in a second device formation region, and each monitor pattern is formed in said first device formation region and said second device formation region.

5. The semiconductor device as defined in claim 1, wherein said monitor pattern has a shorter side of 5 μm or more and a longer side of 150 μm or less.

* * * * *